United States Patent [19]
Schmit et al.

[11] 3,954,518
[45] May 4, 1976

[54] METHOD FOR REDUCING COMPOSITIONAL GRADIENTS IN MERCURY CADMIUM TELLURIDE

[75] Inventors: Joseph L. Schmit, Hopkins; M. Walter Scott, Minnetonka, both of Minn.

[73] Assignee: Honeywell Inc., Minneapolis, Minn.

[22] Filed: Feb. 19, 1975

[21] Appl. No.: 550,877

[52] U.S. Cl. ............................. 148/20.3; 148/1.5
[51] Int. Cl.² ........................................ C22F 1/02
[58] Field of Search ............ 148/1.5, 13, 13.1, 20.3, 148/3; 75/134 H, 135, 151, 169; 252/62.3 ZT, 62.3 V, 501; 423/508

[56] References Cited
UNITED STATES PATENTS
3,723,190   3/1973   Kruse et al. ........................ 148/1.5

Primary Examiner—R. Dean
Attorney, Agent, or Firm—David R. Fairbairn

[57] ABSTRACT

Compositional gradients in a body of mercury cadmium telluride are removed by heat treating the mercury cadmium telluride in a closed container at a temperature which is less than the solidus temperature. The constituent vapor pressure within the closed container is maintained at a value which is lower than the equivalent vapor pressure of the constituents of the mercury cadmium telluride body.

4 Claims, 8 Drawing Figures

METHOD FOR REDUCING COMPOSITIONAL GRADIENTS IN MERCURY CADMIUM TELLURIDE

ORIGIN OF THE INVENTION

This invention was made under a contract with the Department of the Air Force.

BACKGROUND OF THE INVENTION

The present invention is concerned with the growth of mercury cadmium telluride. In particular, the present invention is directed to the reduction of compositional gradients in mercury cadmium telluride. For the purposes of this specification, the common chemical equations for mercury cadmium telluride, (Hg,Cd)Te or $Hg_{1-x}Cd_xTe$, will be used.

(Hg,Cd)Te is an intrinsic photodetector material which consists of a mixture of cadmium telluride, a wide gap semiconductor ($E_g$=1.6 eV), with mercury telluride, which is a semi-metal having a "negative energy gap" of about —0.3 eV. The energy gap of the alloy varies linearly with $x$, the mole fraction of cadmium telluride in the alloy. By properly selecting $x$, it is possible to obtain (Hg,Cd)Te detector material having a peak response over a wide range of infrared wavelengths.

(Hg,Cd)Te is of particular importance as a detector material for the important 8 to 14 micron atmospheric transmission "window". Extrinsic photoconductor detectors, notably mercury doped germanium, have been available with high performance in the 8 to 14 micron wavelength interval. These extrinsic photoconductors, however, require very low operating temperatures (below 30°K). (Hg,Cd)Te intrinsic photodetectors having a spectral cutoff of 14 microns, on the other hand, are capable of high performance at 77°K.

The possible application of (Hg,CD)Te as an intrinsic photodetector material for infrared wavelengths was first suggested by W. G. Lawson et al., *J. Phys. Chem. Solids*, 9, 325 (1959). Since that time extensive investigation of (Hg,Cd)Te has been performed. High performance (Hg,Cd)Te detectors have been achieved for wavelengths from about 1 to 30 microns.

Despite the potential advantages of (Hg,Cd)Te as an infrared detector material, (Hg,Cd)Te photodetectors have only recently found wide use in infrared detector systems. The main drawback of (Hg,Cd)Te has been the difficulty in preparing high quality, uniform material in a consistent manner. The preparation of (Hg,Cd)Te crystals having n-type conductivity, which is the desired conductivity type for photoconductive detectors, has been found to be particularly difficult.

Several properties of the Hg-Cd-Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Conventional crystal growth methods, which involve slow cooling along the length of an ingot, produce an extremely inhomogenous body of (Hg,Cd)Te. Second, the high vapor pressure of Hg over the melt makes it difficult to maintain melt stoichiometry. Third, the segregation of excess Te can give rise to pronounced constitutional supercooling.

The crystal preparation technique which has been most successful in producing high quality (Hg,Cd)Te is the technique described by P. W. Kruse et al. in U.S. Pat. No. 3,723,190. This technique involves the bulk growth of homogenous (Hg,Cd)Te alloy crystals by a three part method. First, a liquid solution of the desired alloy composition is quenched to form a solid body of (Hg,Cd)Te. Second, the body is annealed at a temperature near but below the solidus temperature to remove dendrites. Third, the (Hg,Cd)Te is annealed at low temperature in the presence of excess Hg to adjust stoichiometry. This final low temperature anneal takes about 30 days.

The second step of the three step process is required because the rapid solidification of the first step produces a largely single crystal ingot containing a dendritic structure, with alternating regions of high and low mole ratios. As the cooling rate is increased, the dendritic structure becomes finer. The subsequent high temperature anneal at a temperature below the solidus temperature is required to remove the dendrites. While it is possible to remove the dentritic microscopic compositional gradients, which are generally less than one millimeter, the high temperature annealing step takes weeks and leaves macroscopic $x$ gradients on the order of several millimeters unaffected. The removal of macroscopic $x$ gradients by this method takes months or even years and is, therefore, impractical.

SUMMARY OF THE INVENTION

The present invention is a method for reducing compositional gradients to a greater extent than was possible with the previously described process. The compositional gradients are reduced by heat treating a mercury cadmium telluride body at a temperature below the solidus temperature while maintaining a constituent vapor pressure lower than the equivalent vapor pressure of the constituents of the mercury cadmium telluride body.

DESCRIPTION OF THE PREFERRED EMBODIMENTS

Mercury cadmium telluride is grown by a process in which liquid mercury cadmium telluride is solidified rapidly to produce a dendritic crystal of high and low $x$ regions. This dendritic crystal is subsequently annealed to remove the dendritic inhomogenieties. Macroscopic gradients of a few mole % per centimeter from top to bottom of a crystal typically still remain after the anneal.

The present invention is based on the belief that the interdiffusion of mercury telluride and cadmium telluride occurs via mercury vacancies and that the mercury vacancy concentration in the crystal is determined by the mercury pressure. Mercury vacancies increase as the mercury pressure is lowered. In the present invention, the mercury cadmium telluride crystal is annealed while keeping the mercury pressure low. This increases the mercury vacancy concentration, which increases the rate of interdiffusion of the constituents and minimizes the $x$ gradient remaining in the crystal. The mercury pressure can be kept low by controlling the temperature of a portion of the capsule at a lower temperature than the crystal.

Figure 1:
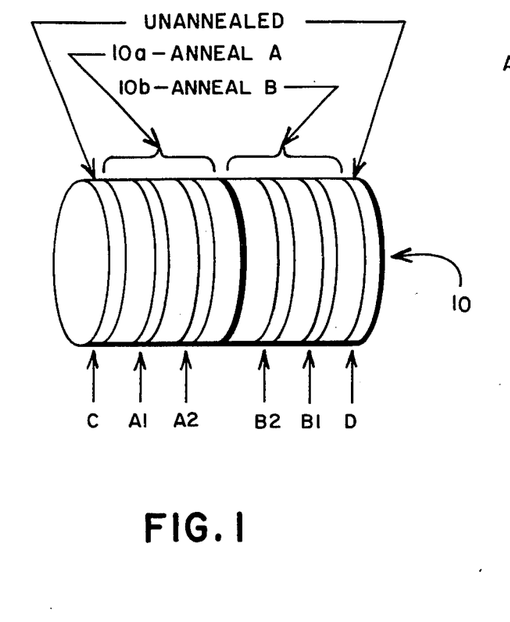
FIG. 1 shows a mercury cadmium telluride crystal used to demonstrate the method of the present invention.

To demonstrate the effectiveness of the present invention, a 22 millimeter section of a mercury cadmium telluride crystal which had never had a high temperature anneal was used. FIG. 1 shows crystal 10, which was used to demonstrate the present invention. Slices C and D, which were about 1 millimeter thick, were cut from opposite ends of crystal 10 and were not annealed. The remaining crystal was cut into two halves, 10$a$ and 10$b$. Half 10$a$ was subjected to a prior art anneal, and half 10$b$ was subjected to the anneal of the present invention.

Figure 2:
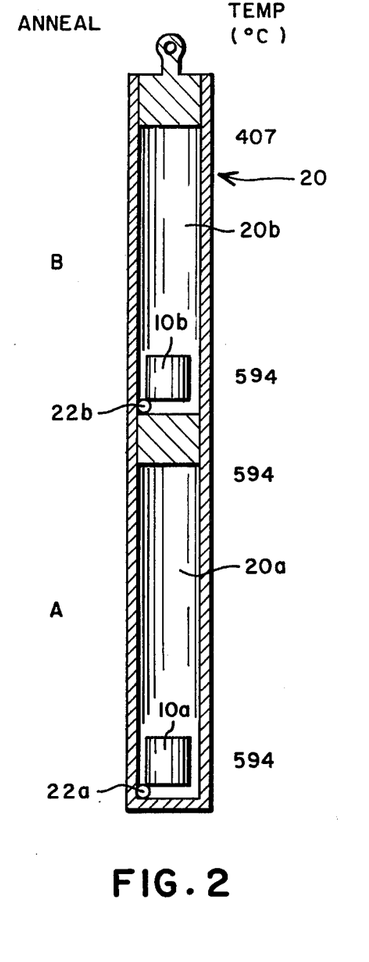
FIG. 2 shows a double capsule used to demonstrate the method of the present invention.

As shown in FIG. 2, crystals 10$a$ and 10$b$ were placed into chambers 20$a$ and 20$b$, respectively, of double capsule 20. Equal amounts of excess mercury 22$a$ and 22$b$ were added to each half of capsule 20.

The experiment was designed to make the side arm (mercury reservoir) temperature and thus the mercury pressure the only variable. Capsule 20 was placed in a furnace and crystals 10$a$ and 10$b$ were annealed at 594°C for 11 days. In anneal A, the temperature of the crystal 10$a$ and the side arm temperature were both 594°C. In anneal B, on the other hand, the temperature of the crystal 10$b$ was 594°C, but the side arm temperature was approximately 200°C cooler (407°C).

Figure 3:
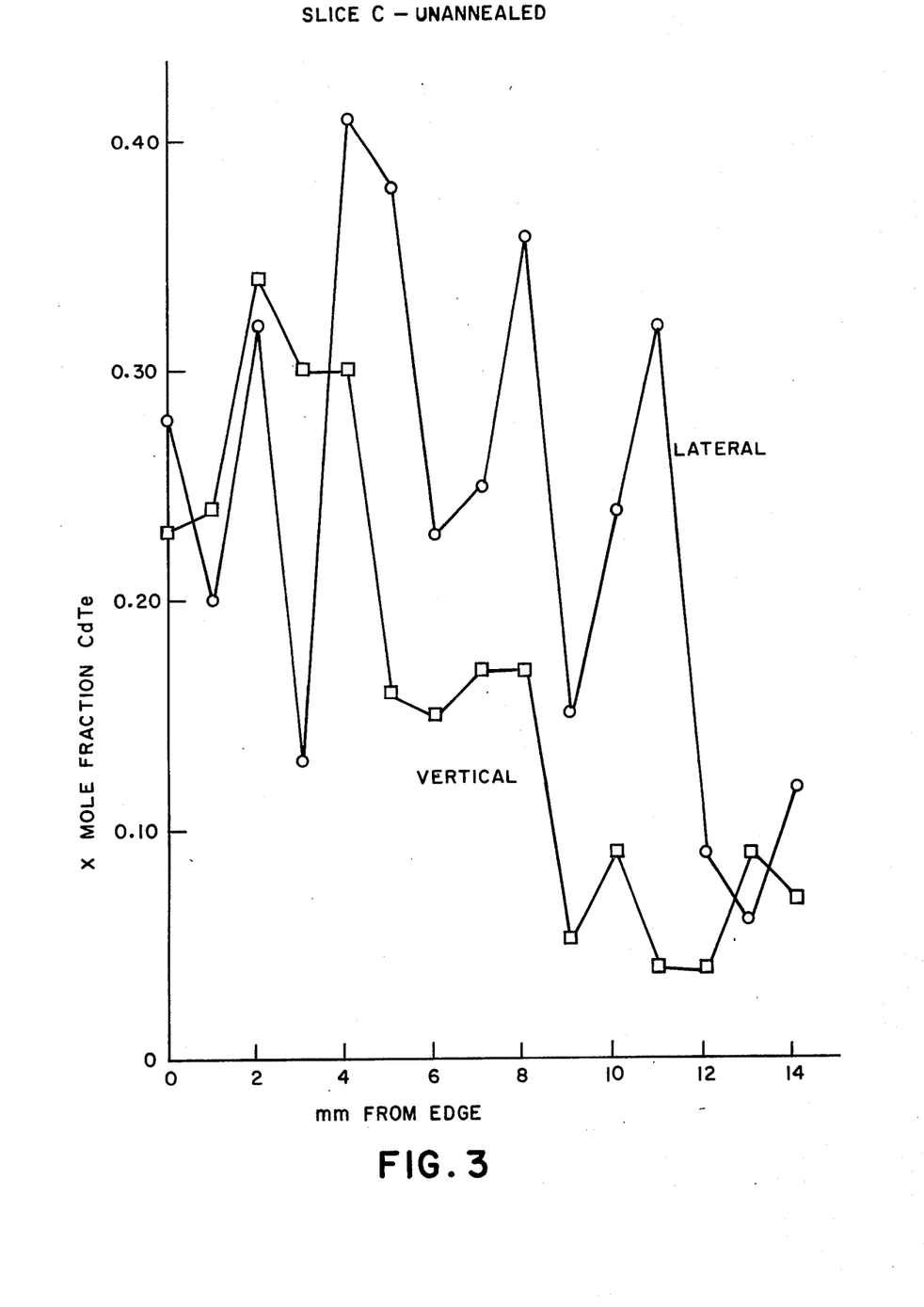
FIG. 3 shows lateral and vertical compositional profiles for unannealed slice C.
Figure 4:
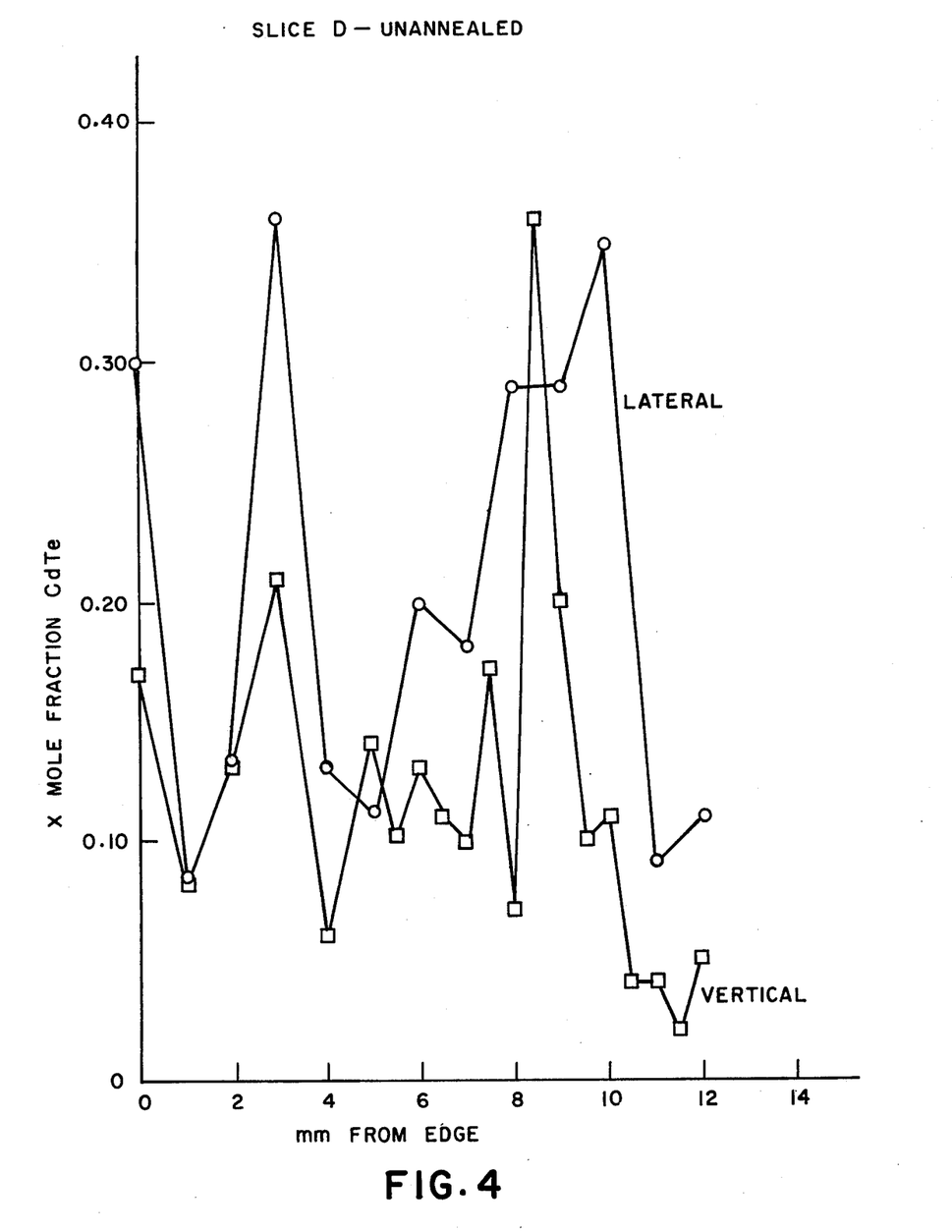
FIG. 4 shows lateral and vertical compositional profiles for unannealed slice D.

FIGS. 3 and 4 show the lateral and vertical compositional profiles as measured by an electron beam microprobe for unannealed control slices C and D. The electron beam microprobe had an accuracy of ±0.01 mole fraction cadmium telluride. Photomicrographs of the surfaces of slices C and D after a revealing etch showed that the microprobe was hitting only about every fifth dendrite on an average. In other words, there were, in fact, 20 to 30 high $x$ dendrites across the diameter in any random direction while FIGS. 3 and 4 show only about five peaks. As shown in FIGS. 3 and 4, the compositional variation was substantial.

Figure 5:
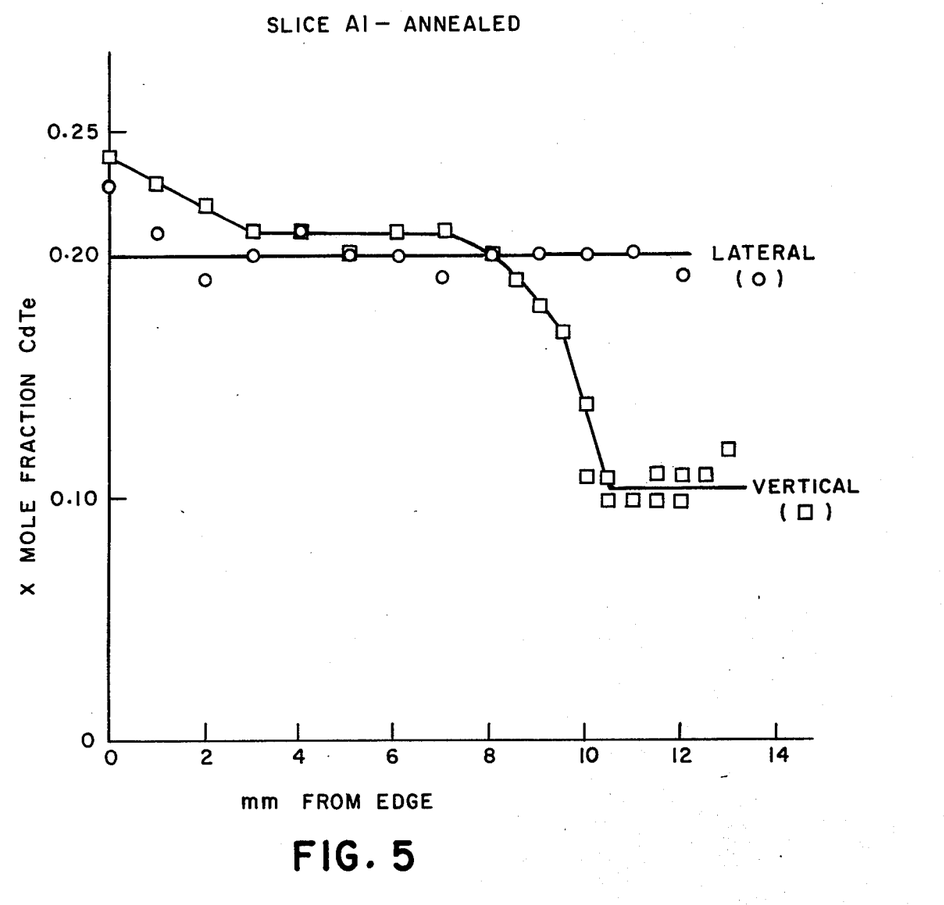
FIG. 5 shows lateral and vertical compositional profiles for slice A1. which was annealed by the prior art method.
Figure 6:
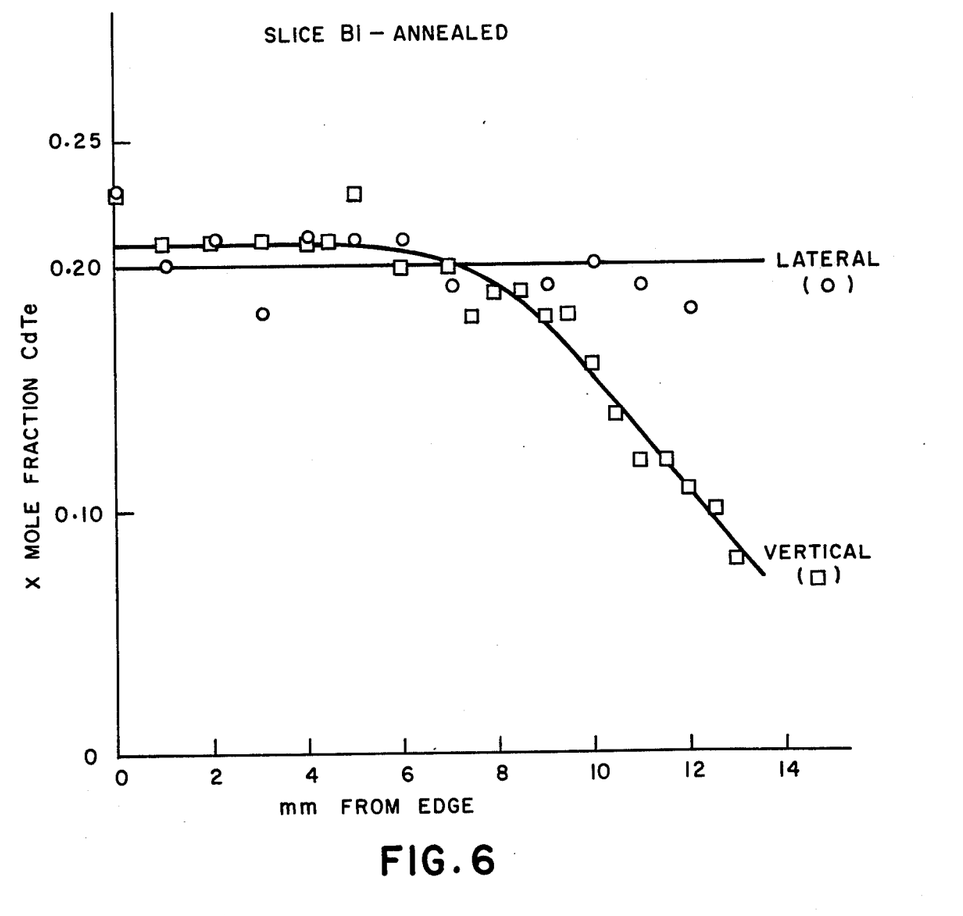
FIG. 6 shows lateral and vertical compositional profiles for slice D1, which was annealed by the method of the present invention.

FIGS. 5 and 6 show lateral and vertical compositional profiles from slices A1 and B1. Slice A1 was subjected to anneal A, while slice B1 was subjected to anneal B. It is clear from FIGS. 5 and 6 that both methods were effective in removing dendrites. Photomicrographs also showed no trace of dendrites. The comparison of FIGS. 5 and 6 does not demonstrate conclusively a reduction in $x$ gradient with reduced side arm temperature. The vertical measurements show anneal B to be better while the lateral measurements appear slightly more uniform in slice A1, which had the high side arm temperature. One possible explanation is that slices A1 and B1 were separated by about 11 millimeters in crystal 10 and may not have had an identical $x$ profile to begin with.

The gradient in composition shown in the vertical profiles of both FIG. 5 and FIG. 6 was expected. This is due to the method of solidification of crystal 10.

Figure 7:
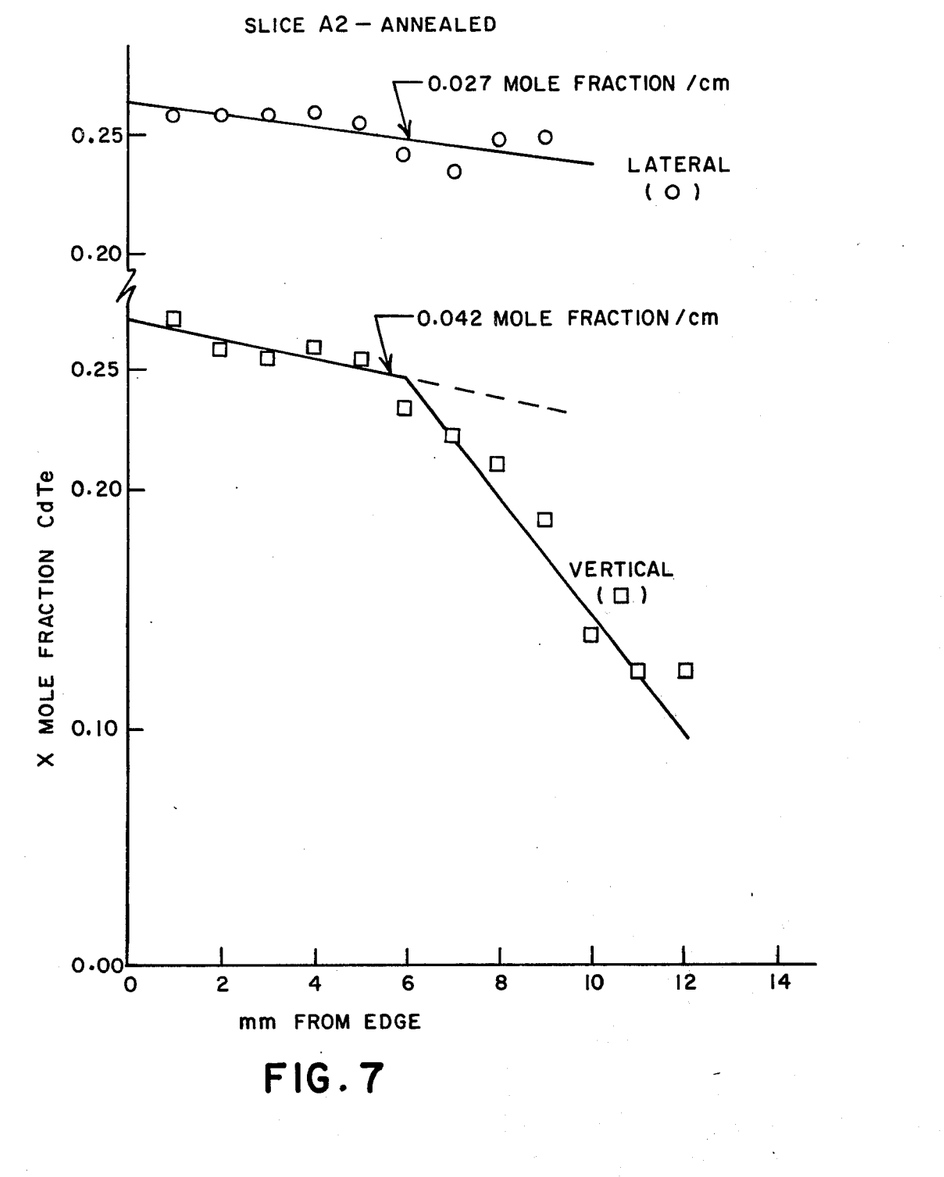
FIG. 7 shows lateral and vertical compositional profiles for slice A2, which was annealed by the prior art method.
Figure 8:
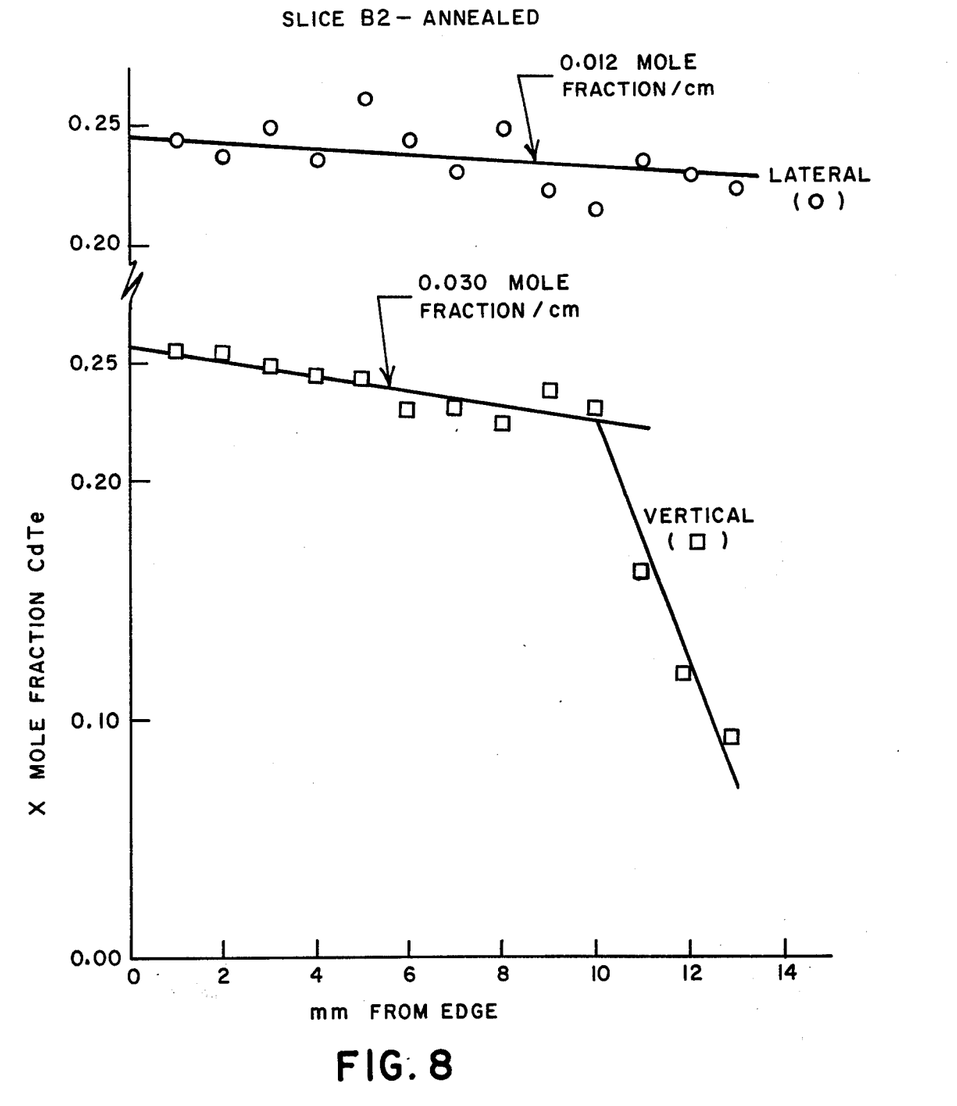
FIG. 8 shows lateral and vertical compositional profiles for slice B2, which was annealed by the method of the present invention.

FIGS. 7 and 8 show two compositional profiles for slices A2 and B2, respectively. The two profiles shown in each of FIG. 7 and FIG. 8 were taken at right angles to one another, and are plotted with the lateral data raised 0.010 mole fraction for clarity.

The compositional profiles shown in FIGS. 7 and 8 are more definitive than those shown in FIGS. 5 and 6. Slices A2 and B2 were less than 3 millimeters apart in crystal 10 as grown. It is unlikely, therefore, that their initial $x$ gradients were much different. The lateral profile shown in FIG. 7 had a gradient of 0.027 mole fraction per centimeter. The lateral profile in FIG. 8, on the other hand, had a gradient of 0.012 mole fraction per centimeter. The vertical profile in FIG. 7 had a gradient of 0.042 mole fraction per centimeter extending only about 5 mm, while the vertical profile in FIG. 8 had a gradient of 0.030 mole fraction per centimeter but extending about 10 mm. The average $x$ gradient for slice A2, therefore, was 0.035 mole fraction per centimeter. The average gradient in slice B2, which was annealed with a low side arm temperature was only 0.021 mole fraction per centimeter. Slice B2, which was annealed with a low side arm temperature had a slightly smaller $x$ gradient but which extended over a much larger volume.

The advantages of the present invention have been demonstrated by heating a portion of a mercury cadmium telluride crystal from room temperature to a temperature near but below the solidus temperature. The present invention, however, is particularly advantageous because it can be performed to an entire ingot with no more processing steps than were used in prior methods. In one preferred embodiment, mercury cadmium telluride liquid solution is rapidly cooled (quenched) from a temperature above the liquidus temperature to a temperature just below the solidus temperature. The high temperature anneal with a low side arm temperature is then immediately commenced. The compositional gradients are reduced by the high temperature anneal. A further, low temperature, anneal to adjust stoichiometry may be performed after the high temperature anneal.

In conclusion, the present invention is an improved method for reducing compositional gradients in mercury cadmium telluride. By providing a low mercury pressure during the heat treatment, the interdiffusion of mercury telluride and cadmium telluride is enhanced.

Although the present invention has been described with reference to preferred embodiments, workers skilled in the art will recognize that the changes in form and detail may be made without departing from the spirit and scope of the present invention. For example, the particular crystal and side arm temperatures selected will depend upon the particular mercury cadmium telluride composition and the amount of excess constituent in the capsule.

The embodiments of the invention in which an exclusive property or right is claimed are defined as follows:

1. In a method of reducing compositional gradients in mercury cadmium telluride by heat treating a mercury cadmium telluride body in a closed container at a temperature near the solidus temperature, the closed container also containing a source of excess mercury vapor, the improvement comprising:

maintaining a mercury vapor pressure within the closed container which is lower than the equilibrium vapor pressure of mercury over a mercury cadmium telluride body at the temperature.

2. A method of reducing compositional gradients in mercury cadmium telluride, the method comprising:

heat treating a mercury cadmium telluride body in the presence of mercury vapor from a source other than the body, in a first portion of a capsule at a temperature near the solidus temperature of the mercury cadmium telluride body; and while maintaining a second portion of the capsule at a temperature less than the temperature of the first portion, whereby mercury vapor pressure within the capsule is lower than the equilibrium vapor pressure of mercury over a mercury cadmium telluride body at the temperature of the first portion.

3. The method of claim 2 wherein the second portion is maintained at a temperature about 200°C less than the temperature of the first portion.

4. A method for reducing compositional gradients in mercury cadmium telluride, the method comprising:

heat treating a body of mercury cadmium telluride at a first temperature near the solidus temperature in a closed environment; and simultaneously maintaining a quantity of constituents selected from the group consisting of mercury, cadmium, tellurium and mixtures thereof, within the same closed environment, at a second temperature lower than the first temperature of the body, to maintain a mercury vapor pressure in the closed environment which is lower than the equilibrium vapor pressure of mercury over a mercury cadmium telluride body at the first temperature.

* * * * *